United States Patent [19]

Bukosky et al.

[11] 4,199,726
[45] Apr. 22, 1980

[54] DIGITALLY TUNABLE INTEGRATED CIRCUIT PULSE GENERATOR AND TUNING SYSTEM

[76] Inventors: Allen A. Bukosky, Rte. 5, Box 270; LaVerne L. Frey, Rte. 1, Box 211A, both of Delavan, Wis. 53115

[21] Appl. No.: 836,170

[22] Filed: Sep. 23, 1977

[51] Int. Cl.$^2$ .......................... H03K 1/16; G04C 9/00
[52] U.S. Cl. .......................................... 328/14; 328/42; 328/48; 328/61; 368/159; 368/189; 340/166 R; 368/200; 307/202.1
[58] Field of Search .............. 58/23 R, 85.5; 328/14, 328/61, 63, 48, 42; 340/166 R; 307/202.1

[56] References Cited

U.S. PATENT DOCUMENTS

| | | | |
|---|---|---|---|
| 3,404,343 | 10/1968 | Strand | 328/48 X |
| 3,614,631 | 10/1971 | Vier | 328/48 |
| 3,656,115 | 4/1972 | Foerster | 340/166 R |
| 3,895,486 | 7/1975 | Hammer et al. | 58/23 R |
| 3,959,737 | 5/1976 | Tanis | 328/42 X |
| 4,009,445 | 2/1977 | Hasegawa | 58/23 R |
| 4,011,516 | 3/1977 | Heimbigner et al. | 328/14 |
| 4,020,626 | 5/1977 | Kuwabara et al. | 58/23 R |
| 4,055,945 | 11/1977 | Schwarzchild et al. | 58/85.5 |

FOREIGN PATENT DOCUMENTS

2270/70  8/1972  Switzerland .......................... 58/23 R

*Primary Examiner*—John S. Heyman

[57] ABSTRACT

An integrated circuit pulse generator which may be externally digitally conditioned to provide an output signal at a frequency falling within a predetermined range of signal frequencies corresponding to a specified frequency tolerance includes a fixed frequency oscillator having an external frequency determining crystal which provides electrical pulses at a fixed frequency that is within a given range of frequencies above a nominal frequency. A pulse inhibit means coupled to the fixed frequency oscillator includes a plurality of programmable input terminals and cyclically inhibits selectable numbers of the electrical pulses responsive to selective actuation of the programmable input terminals to controllably transform the fixed frequency in delta amounts to an output signal frequency within the predetermined range of frequencies. A plurality of fusible links within the integrated circuit couple the programmable input terminals to an actuating potential by a common bus to normally actuate each input, and are also coupled to external pins by address leads to permit application of fusible link opening current to certain ones of the fusible links for removing their corresponding programmable input/terminals from the actuating potential. As a result, selected programmable input terminals may be left actuated to thereby cause the pulse inhibitor to cyclically inhibit a selected number of the electrical pulses to transform the fixed frequency to an output signal frequency within the predetermined range of frequencies. Also disclosed is a system for automatically conditioning the integrated circuit pulse generator for providing an output signal at a frequency within the predetermined range of frequencies corresponding to the specified tolerance.

18 Claims, 5 Drawing Figures

DIGITALLY TUNABLE INTEGRATED CIRCUIT PULSE GENERATOR AND TUNING SYSTEM

BACKGROUND OF THE INVENTION

The present invention is directed in general to a pulse generator and more particularly to an integrated circuit pulse generator which may be externally and digitally conditioned for providing output pulses at a frequency within a predetermined range of frequencies corresponding to a specified frequency tolerance.

There are many applications where it is necessary to be able to generate a series of successive pulses at a frequency which is held to extremely tight tolerances. A prime example of such an application is in the area of electric timekeeping devices such as electric clocks and watches. Where electric time pieces are electrically powered by a 60 cycle alternating current, precise timekeeping is not a problem because an accurately controlled 60 cycle electric power waveform is readily available. However, when the time indicating means of such clocks are powered by a battery or some other d.c. source, the problem of providing an accurately controlled waveform for powering the clock motors or other time indication means becomes extremely acute.

One type of battery powered clock which has found wide acceptance in recent years is the quartz clock. Quartz clocks generally include a pulse generator which coverts a d.c. voltage into electric pulses wherein the electric pulses drive either a time indicating mechanism motor or solid state time indicating devices. Indicative of the name by which they are called, the quartz clock pulse generators comprise a fixed frequency oscillator which includes a frequency-determining quartz crystal. The oscillators provide an output waveform having a first frequency which is divided down by pulse generator dividing circuits to a suitable output frequency for driving the clock motors or solid state devices. Because the pulse generator oscillators are crystal controlled, the output waveform frequency is held virtually constant.

Unfortunately, crystals cannot be economically manufactured to oscillate at a precise desired frequency. Variations in free oscillating frequency must be tolerated and compensated for. As compensation, quartz clocks have generally included a variable trimmer capacitor associated with the oscillator circuit for adjusting the oscillator frequency to a nominal value.

While the prior art techniques of providing a constant series of successive pulses at a tightly controlled frequency have been acceptable, there remains substantial room for improvement to that end. Where a variable capacitor is utilized to compensate for off frequency crystal resonance, the compensating procedure must be performed by hand at considerable expense. Also, only a narrow range of compensation is possible, and as a result, the crystals must be manufactured to close tolerances which makes the crystals not only initially expensive in a highly competitive commercial environment, but also requires continuous and expensive quality control acceptance procedures. Lastly, variable capacitors are inherently subject to instabilities with the passing of time and with changes in environmental conditions such as temperature and humidity. As a result, it is not unlikely that periodic readjustment of the variable capacitor will be required over the useful life span of a pulse generator incorporating a crystal controlled oscillator and a variable compensating capacitor.

There currently exists a partial solution to the problems associated with the prior art. It takes the form of an integrated circuit which includes an internal oscillator adapted for connection to an external crystal and internal divider circuits. Associated with the divider circuits is an internal pulse inhibitor which has weighted programming input terminals which cause the pulse inhibitor to inhibit the oscillator pulses and to thereby controllably vary the frequency of the output signal in delta amounts corresponding to a binary progression. The integrated circuit identified as SCL 5419 manufactured by Solid State Scientific, Inc. of Montgomeryville, Pennsylvania, is adapted to be mounted on an insulating substrate having conductive leads deposited thereon for grounding and actuating each input. This integrated circuit eliminates the variable compensating capacitor, and it has been found that the binary weighted pulse inhibit operation allows broader compensation than is obtainable with variable capacitors.

For controllably varying the output signal frequency, drilling through or otherwise removing portions of certain ones of the conductive leads is required. This procedure requires expensive and precise tooling or must be performed by hand.

This integrated circuit however only represents a partial solution. Because the conductive ground leads occupy considerable substrate area, the substrates are too large to be conveniently received within certain small clock housings or watch cases. Also, the possibility always exists that metal burrs or the like resulting from the drilling process may bridge the otherwise open gap in a conductive lead to result in the wrong frequency being produced.

It is therefore a general object of the present invention to provide a new and improved pulse generator.

It is a further object of the present invention to provide a pulse generator which provides an output waveform at a tightly controlled frequency and which is small enough in size to be received within small clock housings or watch cases.

It is a still further object of the present invention to provide a pulse generator which includes a frequency-determining crystal and which may be automatically adjusted to provide an output signal frequency within a predetermined range of frequencies corresponding to a specified frequency tolerance.

It is a still more particular object of the present invention to provide a pulse generator which is predominantly in integrated circuit form and which includes digital adjustment means within the integrated circuit.

It is a still further object of the present invention to provide a system for automatically and externally conditioning an integrated circuit pulse generator to provide an output frequency within a predetermined range of frequencies.

It is a still more particular object of the present invention to provide a signal transforming means for controllably varying by selectable delta amounts a predetermined parameter of an applied signal.

SUMMARY OF THE INVENTION

The invention provides a signal transforming means having input terminals for controllably varying by selectable delta amounts a predetermined parameter of a signal applied to the inputs. The signal transforming means includes signal parameter varying means coupled to the input terminals including a plurality of control terminals for controllably varying the predetermined signal parameter by selectable delta amounts responsive to the selective application of actuating potential to the control terminals, a common electrical bus coupled to the actuating potential and a plurality of current responsive switch means coupled to the control inputs and responsive to selectively applied current having a required magnitude for controlling the connection of the control inputs to the common bus. Each of the current responsive switch means is arranged to change its conductive state in response to current having the required magnitude and the common bus is arranged for conducting current having magnitudes in a range including the required magnitude.

The present invention also provides a pulse generator for providing an output signal at a frequency that is within a predetermined range of frequencies corresponding to a specified frequency tolerance. The pulse generator includes an oscillator means for providing a first electrical signal at a first frequency, signal transforming means coupled to the oscillating means and including a plurality of control terminals for deriving from the first electrical signal an output electrical signal having an output frequency differing from the first frequency by selectable delta amounts responsive to the selective application of actuating potential to the control terminals, a common electrical bus coupled to the actuating potential, and a plurality of current responsive switch means coupled to the control input and responsive to selectively applied current having a required magnitude for controlling the connection of the control inputs to the common bus. Each of the current responsive switch means is arranged to change its conductive state in response to the current having the required magnitude and the common bus is arranged for conducting current having magnitudes in a range including the required magnitude. As a result, with selected ones of the control terminals being connected to the common bus actuating potential by the current sensitive switch means, the output frequency is caused to differ from the first frequency by a controlled and selected delta amount such that the output frequency is within the predetermined range.

The present invention still further provides a system for adjusting the frequency of a pulse generator to an output frequency within a predetermined range of frequencies corresponding to a specified tolerance with respect to an ideal frequency, wherein the pulse generator is of the type having a means for varying its output frequency by predetermined controlled delta frequency amounts responsive to the programmed condition of a plurality of programmable input terminals coupled to an addressing means. The system includes a first means for detecting a first frequency of the pulse generator and for providing a first signal indicative of the first frequency, second means for providing a second signal indicative of the ideal frequency, programmable input terminal select means coupled to the first and second means and responsive to the first and second signals for selecting the input terminals to be programmed, and programming means for programming the selected programmable input terminals selected by the programmable input terminal select means to cause the pulse generator to vary its output frequency by a selected delta frequency amount for providing an output frequency within the predetermined range of frequencies.

BRIEF DESCRIPTION OF THE DRAWINGS

The features of the present invention which are believed to be novel are set forth with particularity in the appended claims. The invention, together with further objects and advantages thereof, may best be understood by reference to the following description taken in connection with the accompanying drawings, in the several figures of which like reference numerals identify like elements, and in which:

DESCRIPTION OF THE PREFERRED EMBODIMENT

Figure 1:
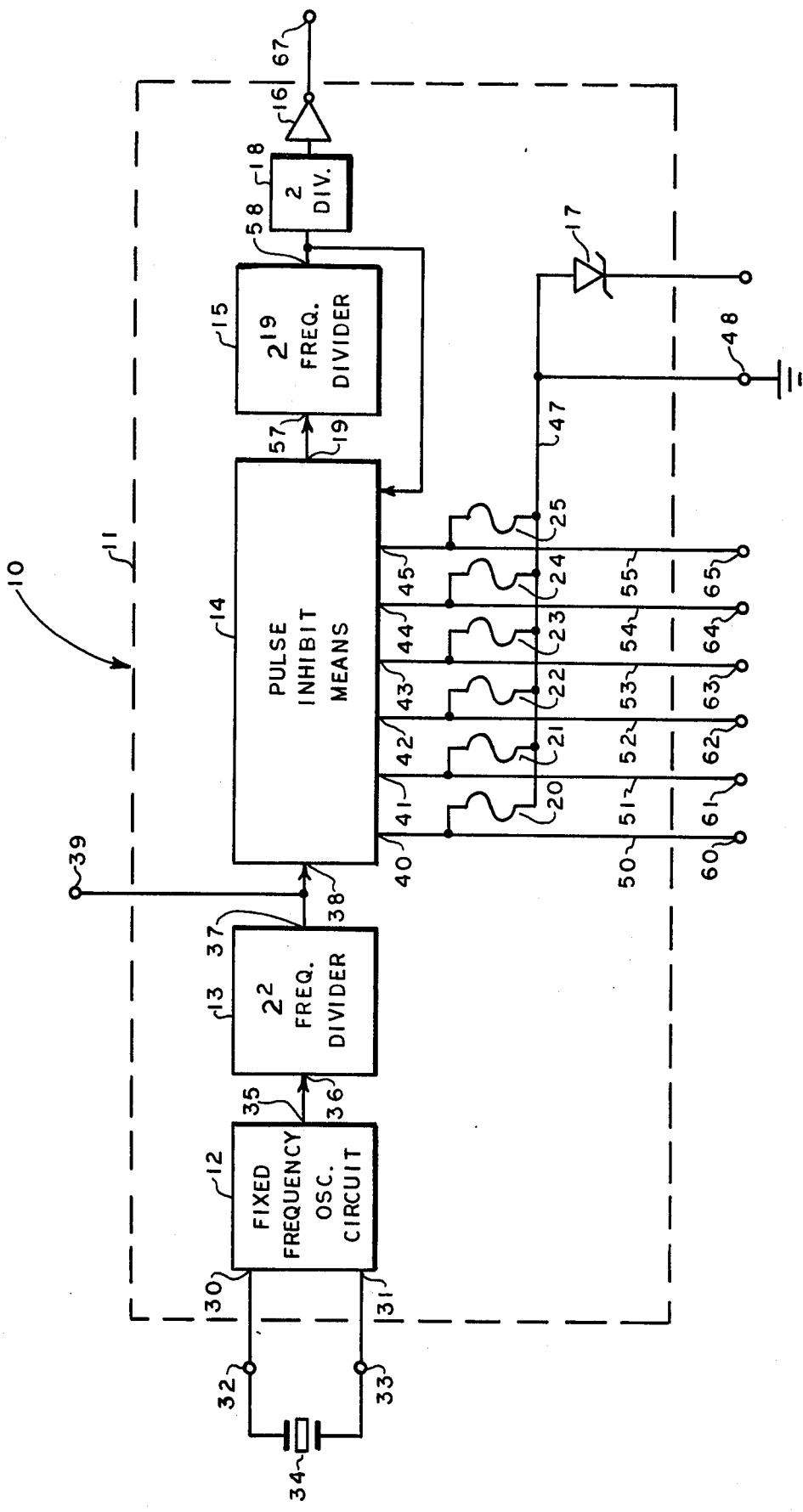
FIG. 1 is a block diagram of a pulse generator embodying the present invention.

FIG. 1 illustrates in block diagram form a pulse generator embodying the present invention which may be utilized for deriving an output signal suitable for use in driving a clock mechanism. The pulse generator generally designated at 10 includes an integrated circuit 11 which comprises internally a fixed frequency oscillator circuit 12, a first frequency divider 13, a signal transforming means in the form of pulse inhibit means 14, a second frequency divider 15, an inverter 16, a Zener diode 17, a third frequency divider 18 and a plurality of current responsive switch means or fusible links 20 through 25.

The fixed frequency oscillator 12 includes a pair of inputs 30 and 31 which are coupled to pins 32 and 33 respectively. Pins 32 and 33 are external to the integrated circuit package. A quartz crystal 34 is coupled across pins 32 and 33 to complete the fixed frequency oscillator and to cause the fixed frequency oscillator circuit 12 to oscillate at the resonant frequency of crystal 34. The fixed frequency oscillator circuit 12 provides successive electrical pulses at a fixed natural frequency determined by the resonant frequency of crystal 34 which is within a given range of frequencies above a nominal frequency. The nominal frequency may for example be, for this preferred embodiment, 4.194304 megahertz. Of course, other fixed frequencies may be used without departing from the present invention. For convenience, the fixed frequency will be hereinafter referred to as the input frequency.

The fixed frequency oscillator circuit includes an output 35 which is coupled to an input 36 of the first frequency divider 13. The first frequency divider 13 divides the input frequency by $2^2$ or by four. The frequency of the signal provided by the first frequency divider at output 37 for convenience will hereinafter be referred to as the first intermediate frequency signal. Because it is the input frequency divided by four, it also is a fixed frequency falling in a range of frequencies above a nominal frequency. Accordingly, its nominal frequency is 1,048,576 Hz. Output 37 of frequency divider 13 is coupled to input 38 of the pulse inhibit means 14 and also to a pin 39 which is external to the integrated circuit package 11. Pin 39 is provided to afford monitoring of the first intermediate frequency to be utilized in an automated pulse generator frequency adjustment process to be described hereinafter.

The pulse inhibit means 14 includes a plurality of programmable input terminals 40 through 45. The pulse inhibit means 14 is of a known kind which includes a plurality of counters which count the intermediate frequency pulses and cyclically inhibits selected numbers of the intermediate frequency pulses responsive to the selective actuation of the programmable input terminals. One such pulse inhibit means will be described subsequently with respect to FIGS. 4 and 5. As previously explained, the input frequency is within a given range of frequencies above a nominal frequency and thus the intermediate frequency is also within a given range of frequencies above a given nominal frequency. The pulse inhibit means 14, responsive to the selective actuation of the programmable inputs 40 through 45, inhibits selected numbers of the intermediate frequency pulses to derive an output signal at output 19 of the pulse inhibit means 14 having a frequency which is within a predetermined frequency range of frequencies corresponding to a specified frequency tolerance.

Thus fusible links 20 through 25, preferably formed by narrow conductive patterns on the integrated circuit substrate, couple the programmable input terminals 40 to 45 respectively to an actuating potential to normally actuate all of the programmable input terminals. Specifically, as shown in FIG. 1, each respective given one of the fusible links 20 through 25 couples a respective given one of the programmable input terminals 40 to 45 to an actuating potential, which is ground potential, by a common bus 47 within the integrated circuit 11. Common bus 47 is preferably formed by a deposit of conductive material on the integrated circuit substrate. The common bus 47 is coupled to an external ground pin 48 which couples the common bus 47 to ground potential. A plurality of address leads 50 through 55 which are also within the integrated circuit package 11 couple the programmable input terminals 40 through 45 and the side of fusible links 20 through 25 opposite common bus 47 to external address pins 60 through 65 respectively. The address leads 50 through 55 are most preferably formed by another deposit of conductive material on the substrate.

With this arrangement, the common bus 47 and address leads 50 through 55 permit the application of fusible link fusing or opening current with a required magnitude to selected ones of the fusible links for disconnecting selected ones of the programmable input terminals 40 through 45 from the actuating ground potential. For example, should it be found necessary for programmable inputs 40 through 44 to be actuated for required pulse inhibiting, input 45 must be disconnected from the actuating ground potential. To this end, a suitable voltage is applied across external pin 65 and ground pin 48 to cause a fusible link opening current to flow through addressing lead 55, through fusible link 25, common bus 47, and to ground. A fusible link opening current of required and sufficient magnitude will cause fusible link 25 to fuse or open and to thus remove input 45 from ground potential. As a result, inputs 40 through 44 will remain coupled to the actuating ground potential to cause the pulse inhibit means to inhibit the proper number of pulses at a periodic rate. Common bus 47 should be so formed along its entire length so that it can safely conduct current having magnitudes in a range of magnitudes including the required magnitude to fuse the links 20 through 25 so that the common bus will remain intact and not be itself destroyed.

Output 19 of pulse inhibit means 14 is coupled to input 57 of the second frequency divider 15 which is in turn coupled to the third frequency divider 18. The second and third frequency dividers divide the frequency of the signal derived by the pulse inhibit means 14, hereinafter referred to as the second intermediate frequency signal, by a factor of $2^{20}$. The second frequency divider 15 divides the second intermediate frequency by a factor of $2^{19}$ and the third frequency divider 18 divides by a factor of 2. The resultant output frequency at the output of third frequency divider 18 will then be the ultimate output frequency of the pulse generator which is inverted by inverter 16 and applied to external output pin 67. Output 58 of second frequency divider 15 is also coupled to pulse inhibit means 14 for reasons to be explained subsequently with respect to FIGS. 4 and 5.

The programmable input terminals 40 through 45 are binary weighted to cause the pulse inhibitor to inhibit the first intermediate frequency pulses in a digitally selected manner to thereby vary its output frequency by selectable delta amounts corresponding to a binary progression to the base 2, starting with the inhibiting of four pulses. For example, should only input 40 remain grounded, four of the intermediate frequency pulses will be inhibited for every 1,048,576 intermediate frequency pulses. Should only input 41 remain grounded, the pulse inhibit means will inhibit eight intermediate frequency pulses for every 1,048,576 intermediate frequency pulses. Should inputs 40 and 41 remain grounded while the rest of the inputs be removed from ground potential, then twelve pulses will be inhibited for every 1,048,576 intermediate frequency pulses counted. Because there are six binary weighted programmable inputs, 4, 8, 16, 32, 64 and 128 intermediate frequency pulses, or any summed combination thereof, may be inhibited for every 1,048,576 pulses.

As an example of the degree of resolution mathematically possible by practicing the present invention, if the resonant frequency of the crystals vary within a range from the nominal frequency to 1011 cycles above nominal, the pulse inhibit means 14 may be programmed to provide an output signal having an output frequency within 3 Hz of the nominal frequency of 1,048,576 Hz. As a result, even with wide variations in crystal resonant frequencies, the output frequency of the pulse generator may be adjusted to a frequency which is within a very small range of frequencies corresponding to a very small frequency tolerance.

Figure 2:
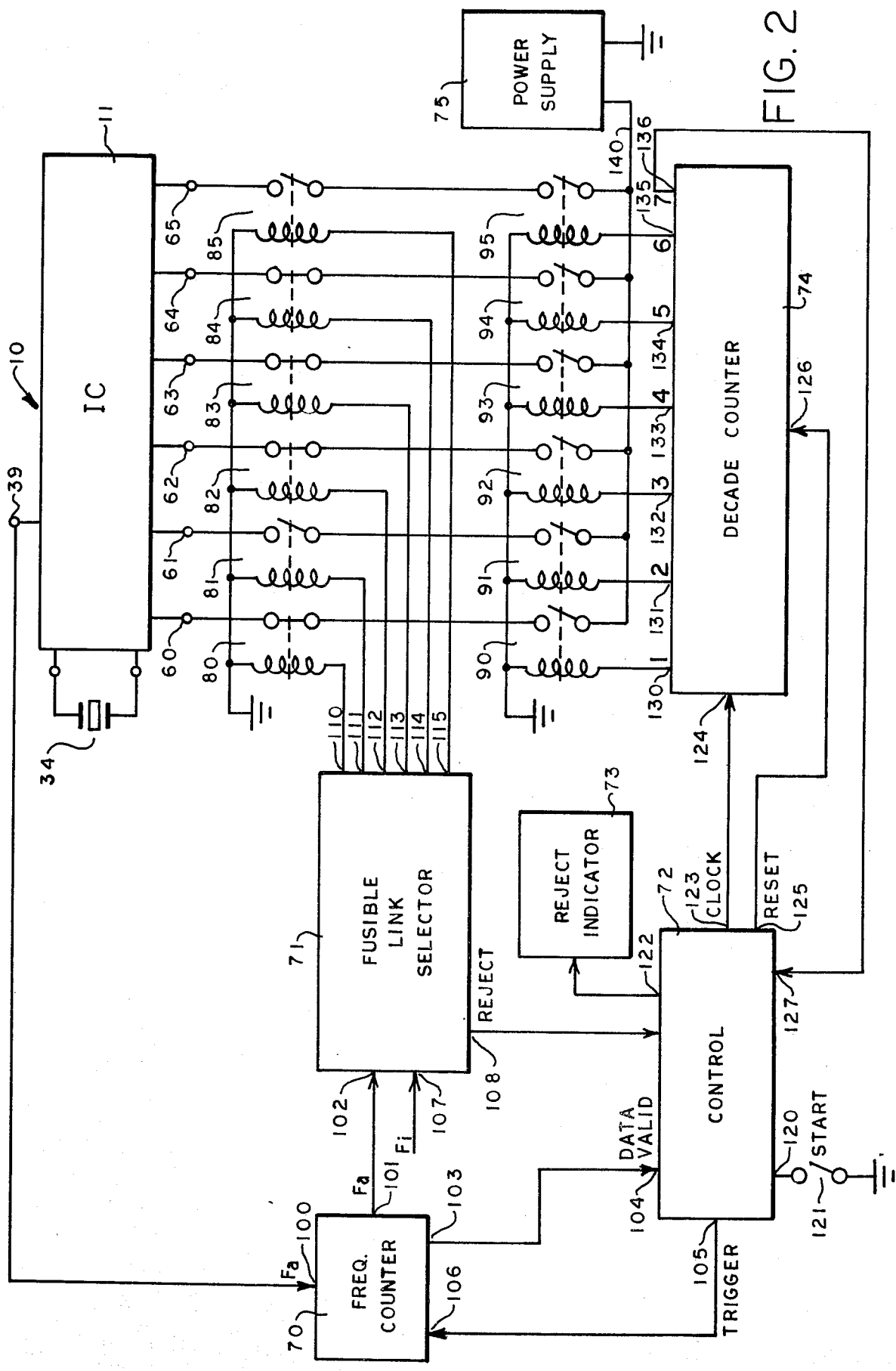
FIG. 2 is a block schematic diagram of a system for digitally adjusting the pulse generator.

Referring now to FIG. 2, it illustrates in block schematic form a system which may be utilized for digitally adjusting the frequency of the integrated circuit pulse generator by selectively applying fusible link opening current to selected ones of the fusible links. The system of FIG. 2 includes a frequency counter 70, fusible link selector 71, a control 72, reject indicator 73, decade counter 74, and a power supply 75. The system of FIG. 2 also includes a first plurality of relays 80 through 85 and a second plurality of relays 90 through 95.

The pulse generator 10 comprising the integrated circuit 11 and external crystal 34 is shown connected to the system of FIG. 2 in a manner to ready it for being adjusted. The external test terminal 39 which provides the first intermediate frequency is coupled to an input 100 of frequency counter 70. Frequency counter 70 has an output 101 coupled to an input 102 of the fusible link selector 71 for providing the actual fixed intermediate frequency to the fusible link selector. Frequency counter 70 has another output 103 which is coupled to an input 104 of control 72. Control 72 has a trigger output 105 coupled to an input 106 of frequency counter 70.

Fusible link selector 71 provides two necessary functions during the adjustment of pulse generator 10. First, it determines whether the frequency of the pulse generator is adjustable to within the given range of frequencies and secondly, if the pulse generator is adjustable, it determines which ones of the fusible links are to be opened and which ones of the fusible links are to remain intact for coupling their respective inputs to the actuating ground potential for properly adjusting the pulse generator. The fusible link selector has another input 107 which is coupled to a suitable frequency generator (not shown) which provides a signal indicative of the ideal intermediate frequency designated $F_i$. The fusible link selector also includes a reject output 108 which provides a signal upon detecting that the pulse generator to be adjusted is not adjustable. It also includes a plurality of control outputs 110 through 115. The control outputs 110 through 115 are coupled to the relay coils of relays 80 through 85 respectively. Each of the relays 80 through 85 includes a normally closed contact coupled to a respective given one of the integrated circuit external address pins 60 through 65. When a fusible link is to be opened so that its corresponding programmable input terminal is removed from its actuating ground potential, a respective one of the control outputs 110 through 115 will provide a logical zero signal which will cause the relay contact to remain closed. If a fusible link is to remain intact, a respective one of the control ouputs will provide a logical one signal to the proper relay coil which causes the normally closed contact to open.

Control 72 controls the operational sequence of the system. It includes an input 120 which is selectively coupled to ground by start switch 121. Control 72 also includes an output 122 which is coupled to the reject indicator 73 for providing an indication that the pulse generator to be adjusted is not adjustable. Clock output 123 is coupled to an input 124 of decade counter 74 for sequentially clocking the decade counter and reset output 125 is coupled to a reset input 126 of the decade counter for resetting the decade counter.

Decade counter 74 includes a plurality of outputs 130 through 135 which are coupled to the relay coils of relays 90 through 95 respectively. The outputs 130 through 135 sequentially provide actuating signals to the relay coils for actuating the relays 90 through 95 in a sequential manner. Output 136 of decade counter 74 is coupled to input 127 of control 72 for initiating resetting of the system after each of the relays 90 through 95 has been sequentially actuated.

Each of the relays 90 through 95 includes a normally open contact which closes upon the receipt by its associated relay coil of an actuating signal from the decade counter. The normally open contacts of relays 90 through 95 are coupled at one side to power supply 75 by common lead 140 and are coupled in series at their other sides with respective given ones of the normally closed contacts of relays 80 through 85.

Power supply 75 is of the type which provides a predetermined magnitude of current and voltage required for fusing or opening the respective given ones of the fusible links which are to be opened. For example, power supply 75 may provide an output voltage of 8 volts at a current of one ampere.

Figure 3:
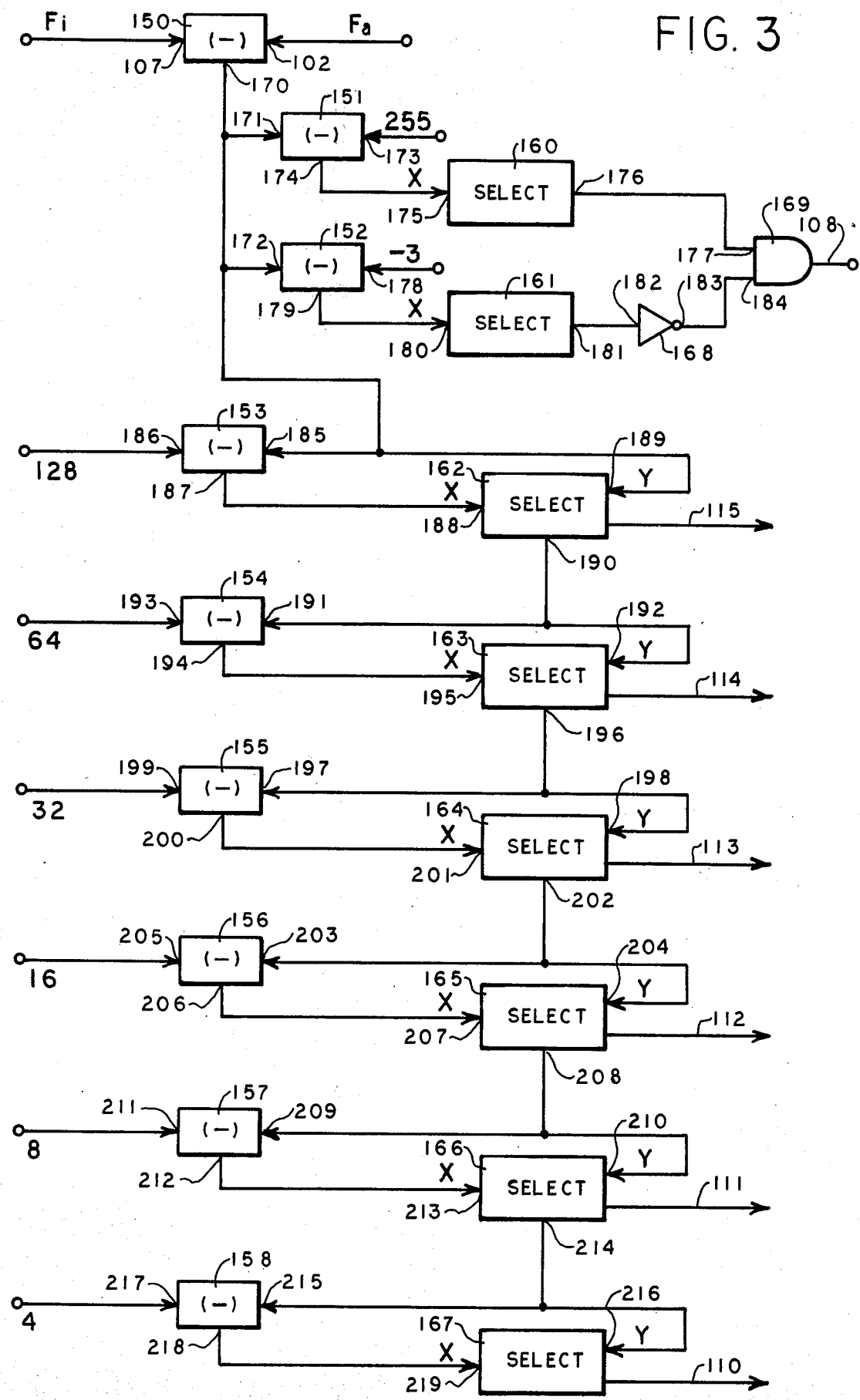
FIG. 3 is a schematic circuit diagram of the fusible link selector of FIG. 2.

The fusible link selector 71 is shown in detail in FIG. 3. It includes a plurality of subtracting circuits 150 through 158, a plurality of select circuits 160 through 167, an inverter 168, and an AND gate 169.

The subtracting circuits 150 through 152, the select circuits 160 and 161, the inverter 168, and the AND gate 169 comprise the reject detector of the fusible link selector. Subtracting circuit 150 includes the input 107 which is coupled to the pulse generator (not shown) which provides a signal indicative of the ideal intermediate frequency and the input 102 which is coupled to frequency counter 70 (FIG. 2) for receiving a signal indicative of the actual intermediate frequency $F_a$. Subtracting circuit 150 also includes an output 170 which is coupled to an input 171 of subtracting circuit 151 and to input 172 of subtracting circuit 152. Output 170 of subtracting circuit 150 provides the difference between the ideal intermediate frequency and the actual intermediate frequency which is received at inputs 171 and 172 of subtracting circuits 151 and 152 respectively.

Subtracting circuit 151 has another input 173 for providing it with an input for the subtracting of the difference frequency from 255. The factor of 255 is obtained because the six programmable inputs of the integrated circuit 11 (FIG. 2) are weighted in a binary manner for inhibiting the first intermediate frequency pulses. As previously explained, the programmable inputs of the integrated circuit 11 inhibit 4, 8, 16, 32, 64 and 128 pulses respectively. Because the number of pulses which may be inhibited by each input may be summed together, a total of 252 pulses for every 1,048,576 intermediate frequency pulses may be inhibited. As a result, the system of FIG. 2 in conjunction with the programmable inputs may adjust the frequency of a pulse generator having a first intermediate frequency in the range of 255 Hertz above the ideal frequency to 3 Hertz below the ideal frequency. This corresponds to crystal resonant frequencies in the range of 1020 Hertz above to 12 Hertz below the ideal crystal resonant frequency because the input frequency is divided by 4. Subtracting circuit 151 also includes an output 174 which is coupled to an input 175 of select circuit 160. Select circuit 160 also has an output 176 which is coupled to an input 177 of AND gate 169.

In a similar manner, subtracting circuit 152 includes another input 178 which provides it with a given factor to be subtracted from the difference frequency at its input 172. The given factor to be subtracted in subtracting circuit 152 is −3 for reasons explained above. Subtracting circuit 152 also includes an output 179 which is coupled to input 180 of select circuit 161. Select circuit 161 also includes an output 181 which is coupled to input 182 of inverter 168. Inverter 168 has an output 183 which is coupled to an input 184 of AND circuit 169.

The subtracting circuits 153 through 158 and select circuits 162 through 167 comprise the fusible link selecting portion of the fusible link selector. Subtracting circuit 153 has an input 185 which is coupled to output 170 of subtracting circuit 150 for receiving the difference frequency. Subtracting circuit 153 has another input 186 for subtracting a given factor of 128 from the difference frequency at input 185. The factor of 128 corresponds to the number of intermediate frequency pulses which may be inhibited when programmable input 45 remains grounded. Subtracting circuit 153 also includes an output 187 which is coupled to the "X" input 188 of select circuit 162.

Select circuit 162 includes a "Y" input which is coupled to output 170 of subtracting circuit 150 for receiving the difference frequency therefrom. Select circuit 162 also includes control output 115 which is coupled to the relay coil of relay 85 (FIG. 2) and a select output 190.

Select circuits 162 through 167 function according to the following logic. Referring specifically to select circuit 162, the select control output 115 will be a logical one if X input 188 is greater than or equal to zero, and will be a logical zero if X input 188 is less than zero. Also, select output 190 will be equal to the Y input 189 if X input 188 is less than zero and will be equal to the X input 188 if the X input is greater than or equal to zero.

The select output 190 is coupled to input 191 of subtracting circuit 154 and to the Y input 192 of select circuit 163. Subtracting circuit 154 has an input 193 which is provided with a given factor of 64 to be subtracted from the value at input 191. Subtracting circuit 154 also includes an output 194 which is coupled to the X input 195 of select circuit 163. Select circuit 163 includes a select control output 114 which is coupled to the relay coil of relay 84 (FIG. 2) and a select output 196 which is coupled to input 197 of subtracting circuit 155 and to the Y input 198 of select circuit 164.

Subtracting circuit 155 includes an input 199 which is coupled to a given factor of 32 for subtracting the given factor of 32 from the value at its input 197. Subtracting circuit 155 also includes an output 200 which is coupled to the X input 201 of select circuit 164. Select circuit 164 includes a select control output 113 which is coupled to the relay coil of relay 83 (FIG. 2) and a select output 202 which is coupled to an input 203 of subtracting circuit 156 and to the Y input 204 of select circuit 165.

Subtracting circuit 156 also includes an input 205 which is coupled to a given factor of 16 for subtracting the given factor of 16 from the value at its input 203. Subtracting circuit 156 also includes an output 206 which is coupled to the X input 207 of select circuit 165. Select circuit 165 includes a select control output 112 which is coupled to the relay coil of relay 82 (FIG. 2) and a select output 208 which is coupled to input 209 of subtracting circuit 157 and to the Y input 210 of select circuit 166.

Subtracting circuit 157 also includes an input 211 which is coupled to a given factor of 8 for subtracting the given factor of 8 from the value at input 209. Subtracting circuit 157 also includes an output 212 which is coupled to the X input 213 of select circuit 166. Select circuit 166 includes a select control output 111 which is coupled to the relay coil of relay 81 (FIG. 2) and select output 214 which is coupled to input 215 of subtracting circuit 158 and to the Y input 216 of select circuit 167.

Subtracting circuit 158 also includes an input 217 which is coupled to a given factor of 4 for subtracting the given factor of 4 from the value at input 215 and an output 218 which is coupled to the X input 219 of select circuit 167. Select circuit 167 includes a select control output 110 which is coupled to the relay coil of relay 80 (FIG. 2).

The sequential operation of the system of FIG. 2 will now be described in detail wherein it is assumed that the actual intermediate frequency of the pulse generator 10 to be adjusted is 1,048,713 Hertz. Also, the ideal intermediate frequency of 1,048,576 is also assumed.

The integrated circuit 11 and its associated crystal 34 are first placed in a test fixture which connects the external address pins 60 through 65 to the normally closed contacts of relays 80 through 85 respectively. Immediately thereafter, start switch 121 is closed to actuate control 72.

The first decision to be made is whether the natural or actual intermediate frequency of the pulse generator 10 to be adjusted is within the adjusting range of 253 Hertz and −3 Hertz with respect to the ideal frequency. If it is not within the adjusting range, it is desirable to reject the pulse generator before opening any of its fusible links.

Power is applied to the integrated circuit and it provides at test terminal 39 the actual frequency. The actual frequency is received by the frequency counter at input 100 which measures the actual frequency and provides a suitable signal at output 101 indicative of the actual frequency. That signal is received at input 102 of the fusible link selector 71. The fusible link selector subtracting circuit 150 subtracts the ideal frequency from the actual frequency and provides a difference signal at output 170 indicative of that difference. In this case, the difference is 137.

Subtracting circuit 151 subtracts 137 from 253 and provides at output 174 a signal indicative of that difference which is +116. The output 174 is coupled to the X input 175 of select circuit 160. Because the X input 175 is +116, and therefore greater than zero, its output 176 will provide a logical one signal to input 177 of AND gate 169.

In a similar manner, subtracting circuit 152 subtracts the frequency difference of 137 from −3 which results in a signal at output 179 indicative of that difference which is −140. X input 180 of select circuit 161 will be less than zero which causes a logical zero level signal to be produced at output 181. The logical zero signal is inverted by inverter 168 which impresses upon input 184 of AND gate 169 a logical one level. Both inputs 177 and 184 of AND gate 169 are at a logical one level which causes a logical one level to be produced at output 108. A logical one level at output 108 will indicate that the pulse generator to be adjusted is within the adjustable range. Conversely, a logical zero at output 108 would indicate a reject.

Because the intermediate frequency of the pulse generator is within the adjustable range, there will be no reject signal provided by the fusible link selector 71 at its output 108. Therefore, reject indicator 73 will not indicate a reject. If the intermediate frequency of the pulse generator were outside the adjustable range, the reject signal provided by the fusible link selector would inhibit the control circuit.

Next, the fusible link selector determines which fusible links must be opened in order to adjust the pulse generator so that its intermediate frequency is within the predetermined range of frequencies. Referring to FIG. 3, the difference signal of 137 is impressed upon input 185 of subtracting circuit 153. Subtracting circuit 153 subtracts the given factor of 128 at its input 186 from the difference frequency of 137 and provides at output 187 a signal indicative of its resultant which in this case is a positive 9. X input 188 of select circuit 162 will therefore be at a +9. As previously defined, because X input 188 is greater than zero, its control output 115 will provide a logical one signal to the relay coil of relay 85 to open its normally closed contact. Also, select circuit 162 will provide at the select output 190 the value of its X input which is 9.

The next subtractor 154 subtracts the given factor of 64 from the value of +9 at its input 191 and provides at output 194 a signal indicative of that difference which is −55. X input 195 of select circuit 163 will be at −55 which is less than zero. As a result, the select circuit 163 at its control output 114 will provide to the relay coil of relay 84 a logical zero signal causing its normally closed contact to remain closed. Also, its output 196 will provide the value at its Y input which is +9.

The +9 at output 196 of select circuit 163 is impressed upon the next subtracting circuit 155 at its input 197. Subtracting circuit 155 subtracts the given factor of 32 at its input 199 from the +9 at its input 197 to provide its output 200 a signal indicative of that difference which is −23.

The X input 201 of select circuit 164 will be at −23 which is less than zero. As a result, its control output 113 will provide a logical zero level signal to the relay coil of relay 83 to thereby cause its normally closed contact to remain closed. Also, output 202 of select circuit 164 will be at the value of its Y input which is 9.

In a similar manner, subtracting circuit 156 subtracts its given factor of 16 from the +9 to arrive at a −7 at its output 206. X input 207 of select circuit 165 will therefore be at −7 which is less than zero. Accordingly, its control output 112 will be at a logical zero which is impressed upon the relay coil of relay 82 to thereby cause its normally closed contact to remain closed. Also, output 208 of select circuit 165 will be at the value of its Y input which is positive 9.

Subtracting circuit 157 similarly subtracts its given factor of 8 from the value of +9 at its input 206 and provides a signal at output 212 indicative of the −1 difference. The X input 213 of select circuit 166 will be greater than zero and thus, select circuit 166 will provide at control output 111 a logical one level signal which is impressed upon the relay coil of relay 81 to open its normally closed contact. Also, because the X input is greater than one, output 214 of select circuit 166 will provide the value of its X input which is one and impress it upon input 215 of subtracting circuit 158.

Subtracting circuit 158 subtracts its given factor of 4 from the value at its input 215 which is one and provides at output 218 a signal indicative of that difference which is −3. X input 219 of select circuit 167 will be at −3 which is less than zero and consequently its control output 110 will provide a logical zero level signal which is impressed upon the relay coil of relay 80 to cause its normally closed contact to remain closed.

As a result of the foregoing, it can be seen that in FIG. 2, the normally closed contacts of relays 81 and 85 have been opened by the fusible link selector and the normally closed contacts of relays 80, 82, 83 and 84 have remained closed. This indicates that the fusible links associated with addressing terminals 60 and 62 through 64 will be opened. As a result, a total of 136 pulses will be inhibited after every 1,048,576 intermediate frequency pulses so that the resulting second intermediate frequency signal from the output of the pulse inhibit means 14 (FIG. 1) will be just one Hertz above the ideal frequency, which is well within a predetermined range of +4 Hertz to −2 Hertz with respect to the ideal intermediate frequency.

When the tuning cycle was initiated, the frequency counter first measured the actual intermediate frequency and provided a data valid signal at output 103 which caused a timer within control 72 to run for a predetermined time for preventing further action to take place until the outputs of the fusible link selector 71 had settled to a stable output. Now that this has been accomplished, when the timer times out, the clock signal at output 123 is applied to decade counter 74. As a result, decade counter 74 sequentially actuates each of the relays 90 through 95 and sequentially closes their respective normally open contacts to cause the power supply voltage from power supply 75 to be applied to the fusible links which are associated with closed contacts of relays 80 through 85. After decade counter 74 has sequentially activated each of the relays 90 through 95, those fusible links associated with closed relay contacts of relays 80 through 85 will be opened by the sequentially applied opening current. After the last relay 95 is actuated, output 136 of decade counter 74 provides a signal to input 127 of control 72. That signal causes control 72 to reset decade counter 74 by applying a reset signal from output 125 to input 126 of the decade counter. Also, the control 72 is caused to reset itself.

It must be appreciated that output 19 of pulse inhibit means 14 may, for some applications, be the desired output terminal of the pulse generator. However, for use in timekeeping devices, an output frequency of 1 Hertz is desirable. Therefore, the second and third frequency dividers combine to divide the output frequency of pulse inhibit means 14 by a factor of $2^{20}$ to arrive at the desired 1 Hertz output signal.

Figure 4:
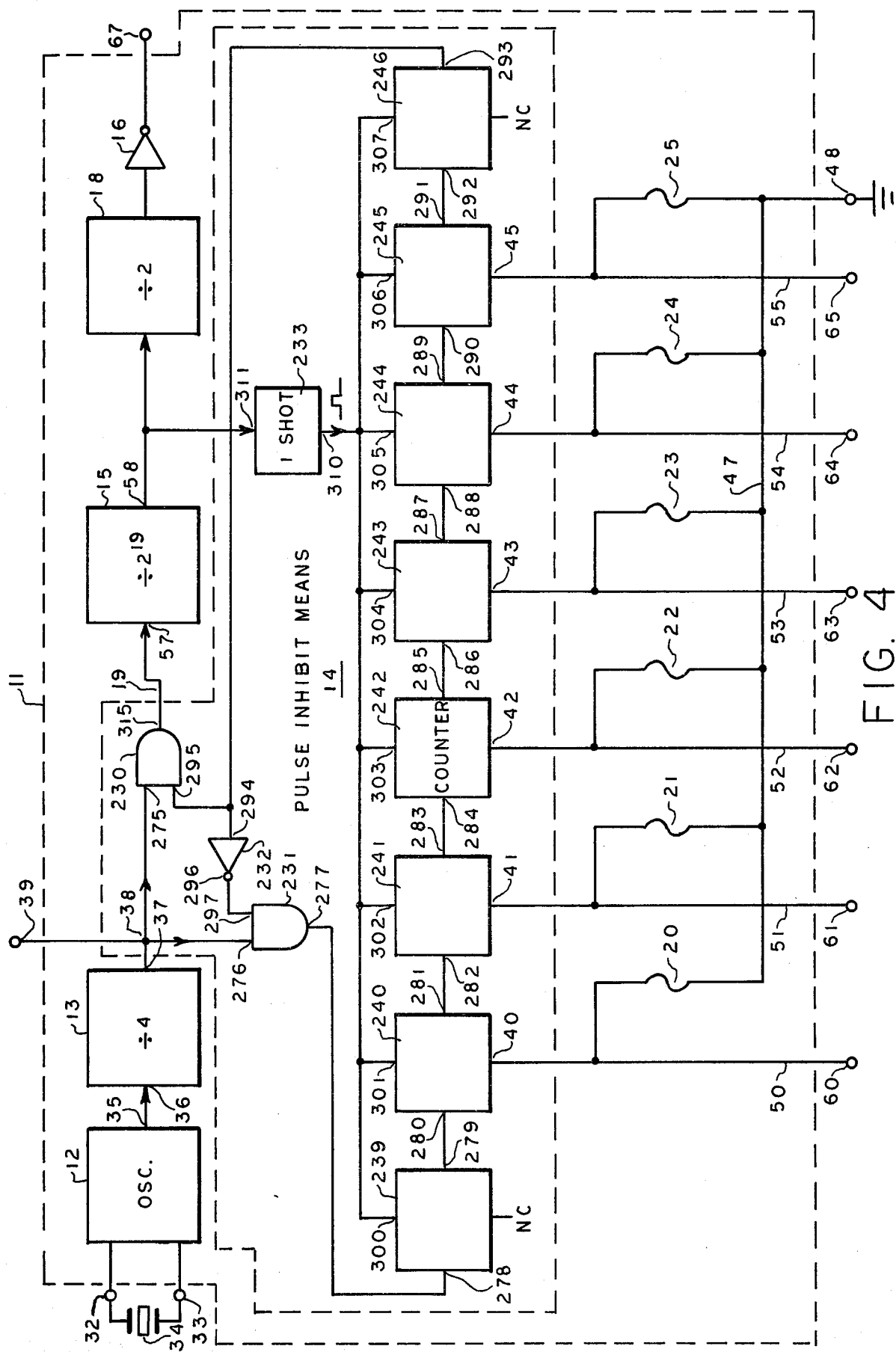
FIG. 4 is a detailed schematic diagram of the pulse generator of FIG. 1.

Referring now to FIG. 4, it shows a detailed circuit diagram of a pulse generator embodying the present invention and is constructed in accordance with the embodiment shown in FIG. 1. In FIG. 4, identical reference characters are utilized when identifying those elements which find correspondence in FIG. 1.

The pulse generator of FIG. 4 comprises the integrated circuit 11 which includes internally the fixed frequency oscillator circuit 12, the first frequency divider 13, the pulse inhibit means 14, the second frequency divider 15, the third frequency divider 18, the inverter 16, and the fusible links 20 through 25.

Oscillator 12 is coupled to external terminals 32 and 33 which has coupled thereacross the quartz crystal 34. The oscillator 12 has an output 35 which is coupled to input 36 of the first frequency divider 13. As previously explained, the nominal resonant frequency of crystal 34 is 4.194304 megahertz and the first frequency divider 13 divides the output frequency of oscillator 12 by a factor of $2^2$ or 4. Consequently, the nominal intermediate frequency at output 37 of first frequency divider 13 is 1.048576 megahertz. The output 37 of first frequency divider 13 is coupled to an external test terminal 39, which, as previously explained, is utilized for monitoring the actual intermediate frequency for use in automatically adjusting the pulse generator to its proper output frequency.

The output 37 of first frequency divider 13 is also coupled to the pulse inhibit means. The pulse inhibit means comprises AND gates 230 and 231, inverter 232, a one-shot circuit 233, and a plurality of one-bit counters 239 through 246.

Figure 5:
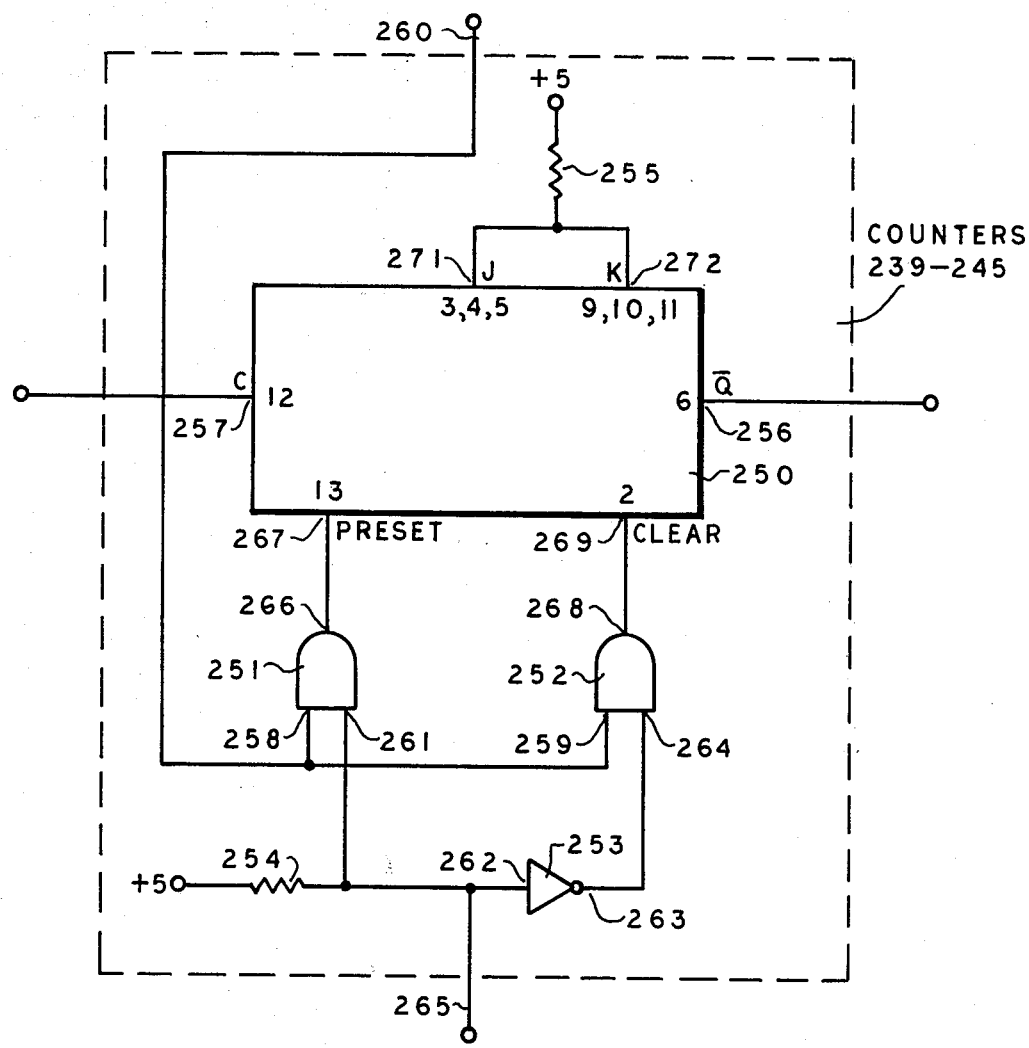
FIG. 5 is a detailed schematic diagram of the pulse inhibit means counters of FIG. 4.

Each of the counters comprises the circuit shown in FIG. 5. Each counter comprises a 7470 JK flip-flop 250, a pair of AND gates 251 and 252, an inverter 253, and a pair of resistors 254 and 255. The counter of FIG. 5 includes a $\overline{Q}$ output 256 and a clock input 257. AND gate 251 and AND gate 252 have inputs 258 and 259 respectively which are coupled together and form a preset strobe input 260. AND gate 251 has another input 261 which is coupled to the common junction of resistor 254 and the input 262 of inverter 253. The common junction of resistor 254, input 261 and input 262 of inverter 253 form a preset data input 265. The output 263 of inverter 253 is coupled to input 264 of AND gage 252. AND gate 251 has an output 266 which is coupled to the preset input 267 of the flip-flop 250. AND gate 252 has an output 268 which is coupled to the clear input 269 of flip-flop 250.

The J input 271 and the K input 272 of flip-flop 250 are coupled to resistor 255. A positive 5 volt power source is applied to resistors 254 and 255 of the counter.

AND gate 230 has an input 275 which is coupled to input 276 of AND gate 231. The common junction 38 formed by the interconnection of inputs 275 and 276 comprises the input to the pulse inhibit means 14.

AND gate 231 has an output 277 which is coupled to the clock input 278 of counter 239. Counter 239 has a $\overline{Q}$ output 279 which is coupled to the clock input 280 of counter 240. Counter 240 has a $\overline{Q}$ output 281 which is coupled to the clock input 282 of counter 241 and counter 241 has a $\overline{Q}$ output 283 which is coupled to the clock input 284 of counter 242. Counter 242 has a $\overline{Q}$ output 285 which is coupled to the clock input 286 of counter 243 which has a $\overline{Q}$ output 287 coupled to the clock input 288 of counter 244. Counter 244 has a $\overline{Q}$ output 289 which is coupled to the clock input 290 of counter 245. Counter 245 has a $\overline{Q}$ output 291 which is coupled to the clock input 292 of counter 246 which has a $\overline{Q}$ output 293 coupled to an input 295 of inverter 232 and an input 294 of AND gate 230. Inverter 232 has an output 296 which is coupled to an input 297 of AND gate 231.

The counters 239 through 246 include the preset strobe inputs 300 through 307 respectively which are coupled together and also coupled to an output 310 of one-shot circuit 233. One-shot circuit 233 has an input 311 which is coupled to the output 58 of the second frequency divider 15.

The second frequency divider output 58 is also coupled to the third frequency divider 18 which is in turn coupled to external output pin 67 through inverter 16. AND gate 230 has an output 315 which comprises the output 19 of the pulse inhibit means.

In accordance with the principal aspects of the present invention, counters 240 through 246 include preset data inputs 40 through 45 which comprise the programmable inputs of the pulse inhibit means 14. Each of the inputs 40 through 45 is coupled to external pins 60 through 65 respectively by address leads 50 through 55 respectively. Each of the fusible links 20 through 25 is coupled between the programmable inputs 40 through 45 and the external ground pin 48 by the common bus 47.

The pulse generator of FIG. 4 operates in the following manner. First, assuming that the crystal 34 resonates at the ideal frequency of 4,194,304 Hertz, the first frequency divider 13 divides that frequency by a factor of 4 to provide the first intermediate frequency at output 37 which is the ideal intermediate frequency of 1,048,576 Hertz. Because the first intermediate frequency is already at the ideal frequency, no pulse inhibiting will be required of the pulse inhibit means 14. Consequently, each one of the fusible links 20 through 25 will be fused by fusible link opening current to prevent the pulse inhibiting means from inhibiting pulses. As a result, the AND circuit 230 couples output 37 of first frequency divider 13 to the second frequency divider 15. The second frequency divider 15 divides the ideal intermediate frequency by a factor of $2^{19}$ and the third frequency divider 18 divides the signal from the second frequency divider 15 by a factor of 2. As a result, the ideal intermediate frequency of 1,048,576 is divided by a factor of $2^{20}$ or 1,048,576. As a result, a one Hertz output signal will be attained at output terminal 67.

Now, assuming that the crystal 34 has a natural resonant frequency of 4,194,320 Hertz, which is 16 Hertz above the ideal, the first divider 13 divides that frequency to derive an intermediate frequency of 1,048,580 Hertz which is 4 Hertz above the ideal intermediate frequency. As a result, the pulse inhibit means will be conditioned via its programmable inputs to inhibit 4 of the intermediate frequency pulses each second so that the output 19 of the pulse inhibit means will provide the ideal number of pulses of 1,048,576 per second to the second and third counters 15 and 18 respectively.

Referring now specifically to the counters 240 through 245, they cause intermediate frequency pulses to be inhibited corresponding to a binary progression depending upon which ones of programmable inputs 40 through 45 are connected to the external ground pin 48 by bus 47 and their respective fusible links 20 through 25. The binary progression is to the base 2 and begins with 4 pulses being inhibited per second. This corresponds to programmable input 40 being coupled to ground. In a similar manner, 8, 16, 32, 64 and 128 pulses will be inhibited respectively responsive to programmable inputs 41, 43, 43, 44 and 45 respectively being coupled to ground. Also as previously explained, any summed combination is possible.

Because the intermediate frequency is 4 Hertz above the ideal, 4 pulses must be inhibited per second. This corresponds to the grounding of programmable input 40. As a result, fusible link 20 will be left intact to couple programmable input 40 to the external ground pin 48. However, fusible link opening current will be sequentially applied between external terminals 61 through 64 and ground terminal 48 to sequentially fuse fusible links 21 through 25.

The pulse generator now works in the following manner. After counter 15 counts 524,286 pulses corresponding to $2^{19}$ pulses, one-shot circuit 233 will be set to preset strobe inputs 300 through 307 of counters 239 through 246. Counter 246 at its $\overline{Q}$ output 293 provides an appropriate logic level signal to input 295 of AND gate 233 to cause it to stop translating pulses to the second frequency divider and simultaneously causes inverter 232 to provide AND gate 231 at input 297 with an input to cause the intermediate frequency pulses to be diverted through AND gate 231 to the counters 239 through 246. After receiving two of the intermediate frequency pulses, the counters 239 through 246 will be satisfied and counter 246 will change its logic level at output 293 to cause AND gate 230 to conduct the intermediate frequency pulses once again to the second divider 15. Simultaneously, AND gate 231 will be turned off.

The second frequency divider 15 counts an additional 524,286 pulses at which time one-shot circuit 233 again is set and sets the preset strobe inputs 300 through 307. Again, this causes counter 246 to provide at output 293 with the appropriate signal for causing AND gate 230 to turn off and AND gate 231 to turn on. As a result, the intermediate frequency pulses are diverted from the second frequency divider 15 and are translated to the counters 239 through 246. Again, two pulses are counted by the counters 239 through 246 and after the second pulse is received, counter 246 provides at output 293 the appropriate signal for once again turning AND gate 230 on and AND gate 231 off.

From the foregoing, it can be seen that for every 1,048,576 intermediate frequency pulses, a minimum total of 4 pulses may be inhibited. Thus, the pulse inhibit means 14 has a resolution of approximately 4 parts per million.

Of course, if the intermediate frequency were even higher than 4 Hertz above the ideal, additional programmable inputs could be left coupled to ground to derive an output frequency which is within a range of frequencies corresponding to the predetermined frequency tolerance.

For example, should the intermediate frequency be 20 Hertz above the ideal, fusible links 20 and 22 would be left intact to cause 20 pulses to be inhibited each second.

Although pulses are being inhibited, the output at external pin 67 will constitute a squarewave output by virtue of the fact that the third frequency counter, which is a divide by two counter, is provided.

Also, although fusible links have been shown and described as the preferred embodiment of obtaining digital adjustment of the pulse generator output frequency, other means are contemplated such as gates which may be made conductive upon receipt of an applied current. With such devices, the pulse generator output frequency may be varied in controllable delta amounts by selectively rendering the gates conductive for actuating the programmable input terminals.

The present invention therefore provides a new and improved integrated circuit pulse generator. The output frequency of the pulse generator may be digitally and externally adjusted to within a given range of frequencies automatically. The pulse generator of the present invention also obviates the shortcomings of the prior art because it may accommodate crystals having a wider range of self-resonant frequencies than heretofore usable. Furthermore, the pulse generator of the present invention is much smaller in physical size than previous pulse generators and therefore can be more readily accommodated in small clock cases or watch enclosures.

While particular embodiments of the present invention have been shown and described, modifications may be made, and it is intended in the appended claims to cover all such modifications which fall within the true spirit and scope of the invention.

We claim:

1. A digitally adjustable pulse generator for providing output pulses at an output frequency within a predetermined range of frequencies corresponding to a specified frequency tolerance, comprising:

fixed frequency oscillator means for providing successive electrical pulses at a fixed frequency, said fixed frequency being within a given range of frequencies above a nominal frequency;
   an integrated circuit substrate containing pulse inhibit means coupled to said oscillator means and including a plurality of programmable input terminals, said pulse inhibit means adapted for cyclically inhibiting selected numbers of said electrical pulses responsive to selective application of actuating potential to said input terminals to derive an output signal at an output frequency within said given range of frequencies;
   a like plurality of fusible links included on said integrated circuit substrate, a respective given one of said fusible links coupling a respective given one of said programmalbe inputs to said actuating potential to thereby normally actuate each said programmable input terminal; and
   addressing means included on said integrated circuit substrate, said addressing means coupled to each one of said fusible links so as to permit the application of fusible link opening current to said fusible links for disconnecting selected ones of said programmable input terminals from said actuating potential and to thereby cause said pulse inhibit means to inhibit said selected number of said electrical pulses so that said derived output frequency is within said given range of frequencies;
   wherein said integrated circuit includes a plurality of external contact means coupled to said addressing means adapted to receive said fusible link opening current and said fusible links are coupled to said actuating potential through a common bus; and,
   a common external contact coupled to said common bus whereby said fusible links receive said opening current applied between said external contact means and said common external contact so that the output frequency of said generator may be adjusted externally to said integrated circuit.

2. A pulse generator as defined in claim 1 wherein said actuating potential comprises ground potential.

3. A pulse generator as defined in claim 1 wherein said common bus is adapted to safely conduct said fusible link opening current without itself opening.

4. A digitally adjustable pulse generator for providing output pulses at an output frequency within a predetermined range of frequencies corresponding to a specified frequency tolerance, comprising:

fixed frequency oscillator means for providing successive electrical pulses at a fixed frequency, said fixed frequency being within a given range of frequencies above a nominal frequency;
   an integrated circuit substrate containing pulse inhibit means coupled to said oscillator means and including a plurality of programmable input terminals for cyclically inhibiting selected numbers of said electrical pulses responsive to selective application of actuating ground potential to said input terminals to derive an output signal at an output frequency within said given range of frequencies;
   a like plurality of fusible links included on said integrated circuit substrate each of said links having a first side and a second side, said first side of a respective given one of said fusible links being coupled to a respective given one of said programmable input terminals;
   a common bus included on said integrated circuit substrate coupling said second side of each said fusible link to said actuating potential for normally actuating each said programmable input terminal;
   a like plurality of address leads included on said integrated circuit substrate, a respective one of said address leads being coupled to said first side of a respective one of said fusible links to permit the application of fusible link opening current between selected ones of said fusible links and said common bus for removing the corresponding ones of said programmable input terminals from said common bus to thereby leave selected ones of said programmable input terminals coupled to said actuating potential through corresponding fusible links for causing said pulse inhibit means to inhibit said selected number of said electrical pulses so that said derived output frequency is within said given range of frequencies, said common bus being adapted to safely conduct said fusible link opening current without itself opening, wherein said integrated circuit substrate includes a plurality of external pins coupled to said address leads adapted to receive said fusible link opening current; and, an external ground pin coupled to said actuating potential and to said common bus, wherein said fusible links receive said opening current applied between said plurality of external pins and said external ground pin so that said generator may be adjusted externally to said integrated circuit substrate.

5. A system for adjusting the frequency of a pulse generator to an output frequency within a predetermined range of frequencies corresponding to a specified tolerance with respect to an ideal frequency, wherein the pulse generator is of the type having a means for varying its output frequency by predetermined frequency amounts responsive to the programmed condition of a plurality of programmable input terminals coupled to an addressing means, said system comprising:

first means for detecting a first frequency of the pulse generator and for providing a first signal indicative of the first frequency;

second means for providing a second signal indicative of the ideal frequency;

programmable input terminal select means coupled to said first and second means and responsive to said first and second signals for selecting the input terminals to be programmed said programmable input terminal select means including means responsive to the difference frequency between the first frequency and the ideal frequency for selecting the programmable input terminals to be programmed; and programming means for programming said selected programmable input terminals selected by said programmable input terminal select means to cause said pulse generator to vary its output frequency by a selected frequency amount for providing an output frequency within the predetermined range of frequencies.

6. A system as defined in claim 5 wherein said programmable input terminal select means further includes a plurality of discrete increment signal means for providing a signal indicative of each said frequency increment and subtracting means associated with each said discrete frequency increment signal means and sequentially operative for subtracting its associated discrete frequency increment from either said difference frequency or a prior subtracting means resulting difference for selecting the programmable input terminals to be programmed.

7. A system for adjusting the output frequency of a digitally adjustable integrated circuit pulse generator to an output frequency within a predetermined range of frequencies corresponding to a specified tolerance with respect to an ideal frequency, wherein the pulse generator includes a fixed frequency oscillator circuit which provides electrical pulses at a natural resonant frequency above the ideal frequency, a pulse inhibitor having a plurality of programmable input terminals for cyclically inhibiting selected numbers of the electrical pulses depending on which ones of the programmable input terminals are actuated for deriving an output frequency within the predetermined range, a like plurality of fusible links normally coupling all the programmable input terminals to an actuating potential, and an addressing system coupling the fusible links to external contacts, said system comprising:

first means for detecting the natural frequency of the pulse generator and for providing a first signal indicative of the natural frequency;

second means for providing a second signal indicative of the ideal frequency;

a power source adapted for providing fusible link opening current; and a fusible link selector coupled to said first and second means and having a plurality of control outputs associated with said external contacts for establishing a circuit between given ones of said fusible links and said power source in response to said first and second signals for opening selected ones of the fusible links so that the remaining fusible links coupling their respective programmable input terminals to the actuating potential cause the inhibit means to inhibit the selected number of electrical pulses to derive an output frequency that is within the predetermined range of frequencies corresponding to the specified tolerance with respect to the ideal frequency.

8. A system as defined in claim 7 further including means for sequentially establishing said circuits between said selected fusible links and said power source.

9. A system as defined in claim 7 further comprising a first plurality of relays coupled to said control outputs for conditioning the connection of said selected fusible links to said power source.

10. A system as defined in claim 9 wherein each of said first plurality of relays has a contact coupled to a respective given one of said external contacts for conditioning said connections.

11. A system as defined in claim 9 further comprising a second plurality of relays coupled in series between said first plurality of relays and said power source.

12. A system as defined in claim 11 further including sequential means for sequentially closing said second plurality of relays for sequentially connecting said first plurality of relays to said power source.

13. A system as defined in claim 12 wherein said sequential means comprises a decade counter.

14. A system as defined in claim 7 wherein the pulse generator pulse inhibitor has facility for deriving an output frequency within the predetermined range from natural frequencies within a given range of frequencies, and wherein said fusible link selector also includes means for detecting natural frequencies outside the given range and for providing a reject indication responsive to such detection.

15. A system for adjusting the frequency of a pulse generator to an output frequency within a predetermined range of frequencies corresponding to a specified tolerance with respect to an ideal frequency, wherein the pulse generator is of the type having a means for varying its output frequency by predetermined frequency amounts responsive to the programmed condition of a plurality of programmable input terminals coupled to an addressing means, said system comprising:

first means for detecting a first frequency of the pulse generator and for providing a first signal indicative of the first frequency;

second means for providing a second signal indicative of the ideal frequency;

programmable input terminal select means coupled to said first and second means and responsive to said first and second signals for selecting the input terminals to be programmed said programmable input terminal select means including means for detecting first frequencies outside said given range and for providing a reject indication responsive to such detection; and programming means for programming said selected programmable input terminals selected by said programmable input terminal select means to cause said pulse generator to vary its output frequency by a selected frequency amount for providing an output frequency within the predetermined range of frequencies.

16. An integrated circuit substrate containing signal transforming means having signal input terminals for controllably varying by selectable amounts a predetermined parameter of a signal applied to the signal transforming means comprising:

signal parameter varying means coupled to said signal input terminals and including a plurality of programmable input terminals, said signal parameter varying means adapted for controllably varying said predetermined signal parameter by selectable amounts responsive to selective application of actuating potential to said programmable input terminals;

a like plurality of fusible links, a respective given one of said fusible links coupling a respective given one of said programmable inputs to said actuating potential to thereby normally actuate each said programmable input terminal;

addressing means coupled to each one of said fusible links so as to permit the application of fusible link opening current to said fusible links for disconnecting selected ones of said programmable input terminals from said actuating potential and to thereby cause said signal parameter varying means to controllably vary said predetermined signal parameter by selectable amounts;

wherein said integrated circuit includes a plurality of external contact means coupled to said addressing means adapted to receive said fusible link opening current and said fusible links are coupled to said actuating potential through a common bus; and a common external contact coupled to said common bus whereby said fusible links receive said opening current applied between said external contact means and said common external contact so that said predetermined signal parameter may be controllably varied by selectable amounts externally to said integrated circuit.

17. An integrated circuit substrate as defined in claim 16 wherein said common bus is adapted to safely conduct said fusible link opening current without itself opening.

18. An integrated circuit substrate containing signal transforming means having signal input terminals for controllably varying by selectable amounts a predetermined parameter of a signal applied to the signal transforming means comprising:

signal parameter varying means coupled to said signal input terminals and including a plurality of programmable input terminals, said signal parameter varying means adapted for controllably varying said predetermined signal parameter by selectable amounts responsive to selective application of actuating potential to said programmable input terminals;

a like plurality of fusible links, a respective given one of said fusible links coupling a respective given one of said programmable inputs to said actuating potential to thereby normally actuate each said programmable input terminal;

addressing means coupled to each one of said fusible links so as to permit the application of fusible link opening current to said fusible links for disconnecting selected ones of said programmable input terminals from said actuating potential and to thereby cause said signal parameter varying means to controllably vary said predetermined signal parameter by selectable amounts;

wherein said integrated circuit includes a plurality of external contact means coupled to said addressing means adapted to receive said fusible link opening current and a common external contact coupled to said fusible links for applying said opening current to said fusible links across said external contact means and said common external contact so that said predetermined signal parameter may be controllably varied by selectable amounts externally to said integrated circuit.

* * * * *